(12) United States Patent
Tsao

(10) Patent No.: US 7,247,812 B2
(45) Date of Patent: Jul. 24, 2007

(54) LASER ANNEALING APPARATUS

(75) Inventor: Yi-Chang Tsao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 371 days.

(21) Appl. No.: 10/250,172

(22) Filed: Jun. 10, 2003

(65) Prior Publication Data

US 2004/0099220 A1 May 27, 2004

(30) Foreign Application Priority Data

Nov. 22, 2002 (TW) .............................. 91134040 A

(51) Int. Cl.
*B23K 26/14* (2006.01)
(52) U.S. Cl. ...................... 219/121.65; 219/121.84; 219/121.86
(58) Field of Classification Search ........... 219/121.84, 219/121.86, 121.65; 438/398
See application file for complete search history.

(56) References Cited

U.S. PATENT DOCUMENTS

| | | | | |
|---|---|---|---|---|
| 5,454,347 A | * | 10/1995 | Shibata et al. ............... | 117/202 |
| 5,943,584 A | * | 8/1999 | Shim et al. .................. | 438/398 |
| 6,027,960 A | * | 2/2000 | Kusumoto et al. .......... | 438/166 |
| 6,423,928 B1 | * | 7/2002 | Piwczyk ................ | 219/121.84 |
| 6,580,053 B1 | * | 6/2003 | Voutsas .................. | 219/121.66 |
| 6,982,214 B2 | * | 1/2006 | Fu et al. ...................... | 438/508 |
| 2002/0037609 A1 | * | 3/2002 | Zhang et al. ............... | 438/162 |

FOREIGN PATENT DOCUMENTS

| | | | | |
|---|---|---|---|---|
| JP | 56-136295 | A | * | 10/1981 |
| JP | 57-91517 | A | * | 6/1982 |
| JP | 60-223694 | A | * | 11/1985 |
| JP | 1259530 | | | 10/1989 |
| JP | 4-109200 | A | * | 4/1992 |
| JP | 9-102467 | A | * | 4/1997 |
| JP | 11-008205 | | | 1/1999 |
| JP | 11-008205 | A | * | 1/1999 |
| JP | 2000-082733 | | | 3/2000 |
| JP | 2000-133612 | A | * | 5/2000 |
| JP | 2000-349041 | | | 12/2000 |
| JP | 2002-093738 | | | 3/2002 |

* cited by examiner

*Primary Examiner*—Geoffrey S. Evans
(74) *Attorney, Agent, or Firm*—Jianq Chyun IP Office

(57) ABSTRACT

An excimer laser annealing apparatus and the application of the same for stabilizing the atmosphere surrounding an area irradiated by an excimer laser. The apparatus includes a chamber, a gas diversion nozzle, an excimer laser and a gas supply device. The gas diversion nozzle is positioned inside the chamber. The laser beam produced by the excimer laser passes through the gas diversion nozzle. The gas supply device connects with the gas diversion nozzle for providing a jet of gas to the laser-irradiated area and carrying away any pollutants from the irradiated area.

17 Claims, 2 Drawing Sheets

LASER ANNEALING APPARATUS

CROSS REFERENCE TO RELATED APPLICATIONS

This application claims the priority benefit of Taiwan application serial no. 91134040, filed on Nov. 22, 2002.

BACKGROUND OF INVENTION

1. Field of Invention

The present invention relates to a laser annealing apparatus and its applications. More particularly, the present invention relates to a laser annealing apparatus that can stabilize the surrounding atmosphere of a laser-irradiated region and the application of the same.

2. Description of Related Art

With the rapid development in technologies, high tech products including video, especially digital video or imaging devices has become an indispensable part in our everyday life. At present, liquid crystal display (LCD) is one of the commonest video and image display devices. In recent years, a type of thin film transistor liquid crystal display (TFT-LCD) manufactured using polysilicon fabrication technique is produced. The TFT-LCD fabricated using polysilicon has electron mobility considerably greater than a conventional TFT-LCD device made from amorphous silicon. Consequently, a smaller thin film transistor with a larger aperture ratio can be built so that brightness level of the display is increased and power consumption of the device is reduced. Moreover, due to an increase in electron mobility, a portion of the driving circuit may be fabricated on the glass substrate along with the thin film transistors. Ultimately, reliability and performance of the liquid crystal display panel is improved and production cost of the display is reduced considerably. Due to a lower production cost of a polysilicon TFT-LCD considerable improvements in the resolution, thickness and weight of the polysilicon TFT-LCD compared with the amorphous silicon TFT-LCD, polysilicon TFT-LCD is routinely used in mobile and portable products to take advantage of its light weight and low power consumption.

Formerly, the polysilicon thin film transistors are fabricated through solid phase crystallization (SPC). However, to withstand the high re-crystallization temperature of up to 1000Å° C., quartz substrate must be used. Yet, quartz substrate costs considerably more than a glass substrate. Moreover, due to limitations in the size of substrate, a panel having a dimension of at most 2 to 3 inches can be produced. Hence, only small polysilicon display panels are produced. With the advent of laser technologies, the transformation of amorphous silicon film into polysilicon film is carried out through laser irradiation. For example, an amorphous silicon film is scanned by a laser source in a laser crystallization or excimer laser annealing (ELA) process so that the amorphous silicon re-crystallizes into polysilicon at a temperature around 600Å° C. Since a lower temperature is used to transform the silicon, ordinary glass panel used in most conventional amorphous silicon TFT can be used to fabricate the polysilicon TFT. Thus, the fabrication of a polysilicon TFT display panel having a larger size is possible. This type of low temperature re-crystallization technique of manufacturing polysilicon is often referred to as a low temperature polysilicon (LTPS) process.

FIG. 1 is a schematic diagram of a conventional laser annealing apparatus for transforming amorphous silicon film into polysilicon film. As shown in FIG. 1, a laser annealing apparatus 100 principally includes a laser source 102 and a chamber 104. An incoming laser window 106 made from quartz glass is located above the chamber 104. A beam of laser 102a from the laser source 102 penetrates the laser window 106 and irradiates the interior of the chamber 104. In addition, a movable apparatus 108 is placed inside the chamber 104. A substrate 110 is normally placed over the movable apparatus 108 so tat the substrate 110 is able to shift position when irradiated by the laser.

In general, liquefied silicon may react with moisture and oxygen in surrounding atmosphere to form contaminants when amorphous silicon film is irradiated with a laser in a re-crystallization process. To prevent contaminants produced inside the chamber 104 from contaminating the polysilicon film and resulting in some unforeseen effects, gaseous nitrogen or inert gas is passed into the chamber 104.

Nevertheless, the aforementioned method can hardly stabilize the atmosphere around a laser-illuminated region so that all kinds of unwanted gaseous contaminants may still pollute the surrounding atmosphere during the laser annealing process. The unwanted gas includes silicon vapor evaporated from the amorphous silicon film at high temperature. One of the components inside the chamber 104 that can be easily polluted by the silicon vapor is the laser window 106. With too much pollution, working life of the incoming laser window 106 may be greatly reduced. To prevent this from happening, an inert gas inlet 104a and an inert gas outlet 104b are installed on each side of the chamber 104 as shown in FIG. 1. Utilizing the purging effect of inert gases, quality of the atmosphere inside the chamber 104 may be conditioned. However, because size of the chamber 104 for carrying out laser annealing process is usually large, a lot of inert gas must be used to purge the atmosphere. Moreover, this arrangement can only produce partial improvement in the atmospheric quality. In fact, little is done to stabilize the atmosphere close to the laser-irradiated region.

SUMMARY OF INVENTION

Accordingly, one object of the present invention is to provide a laser annealing apparatus and an application of the same that can stabilize a laser-irradiated region.

A second object of this invention is to provide a laser annealing apparatus and an application of the same that uses a smaller volume of gases.

A third object of this invention is to provide a laser annealing apparatus and an application of the same that can minimize any variation in the electrical properties of a polysilicon thin film transistor.

To achieve these and other advantages and in accordance with the purpose of the invention, as embodied and broadly described herein, the invention provides a laser annealing apparatus. The laser annealing apparatus includes a laser source, a gas supply device, a chamber and a movable device inside the chamber and a gas diversion nozzle. The air diversion nozzle is wider at both ends and narrower in the middle and hence has a funnel-shape profile. A substrate having an amorphous silicon layer thereon can be placed on the top of the movable device inside the chamber. The gas diversion nozzle is positioned close to the substrate on the movable device. A beam of laser emitted from the laser source enters the chamber and impinges upon the substrate on the movable device via the gas diversion nozzle so that the amorphous silicon film on the substrate is subjected to the scanning laser beam. Hence, the irradiated amorphous silicon film re-crystallizes into a polysilicon film. The gas supply device in the laser annealing apparatus is connected to the gas diversion nozzle inside the chamber through a tube so that gas from the gas supply device is brought to the laser-irradiated location via the tube and the air diversion nozzle. Due to the special profile of the gas diversion nozzle, any unwanted vapor produced from the laser-irradiated region is carried away from the substrate along with the gas flow.

This invention also provides a laser annealing method. An annealing substrate such as an amorphous silicon film is provided. A beam of laser is shone onto a particular location on the substrate and a jet of nitrogen or inert gas is blown over the laser-irradiated region so that the atmosphere surrounding the laser-irradiated region is stabilized.

If the laser-irradiated substrate is an amorphous silicon film, the amorphous silicon film will re-crystallize into a polysilicon film. Hence, this invention can be applied to the fabrication of polysilicon thin film transistor. In addition, the nitrogen or inert gas blowing over the annealing substrate may be replaced using a gas with dopants therein so that the laser-irradiation operation is accompanied by a doping implantation.

Due to the deployment of a special gas diversion nozzle in this invention, nitrogen, inert gas or some dopants infused gas may target at a laser-irradiated region with great accuracy and carry away any harmful gases produced by the laser in the stream of outflow. Therefore, this invention is particularly useful in setting up a stable environment surrounding a laser-irradiated region with a minimum gas flow and hence reduces gases charges substantially. When the apparatus according to this invention is applied to the production of polysilicon thin film transistor, possible contaminants such as the ones resulting from a reaction between liquefied silicon with moisture and oxygen in the air will no longer contaminates the polysilicon thin film transistor. Ultimately, the polysilicon thin film transistor will have electrical properties according to design.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
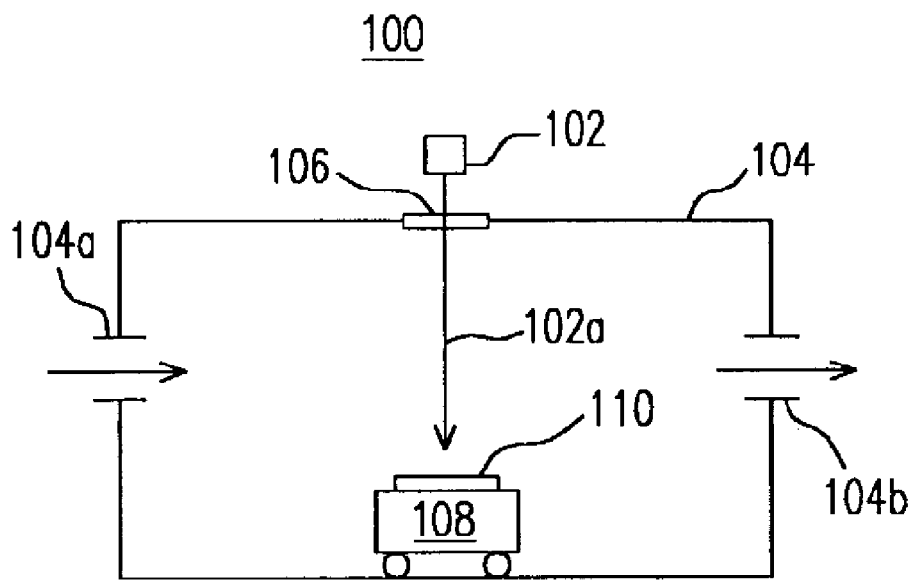
FIG. 1 is a schematic diagram of a conventional laser annealing apparatus for transforming amorphous silicon film into polysilicon film.

Reference will now be made in detail to the present preferred embodiments of the invention, examples of which are illustrated in the accompanying drawings. Wherever possible, the same reference numbers are used in the drawings and the description to refer to the same or like parts.

Although a laser annealing apparatus is used in the embodiment of this invention, this invention can be applied to other beam-illuminating apparatus to stabilize the atmosphere surrounding a beam-illuminated region.

Figure 2:
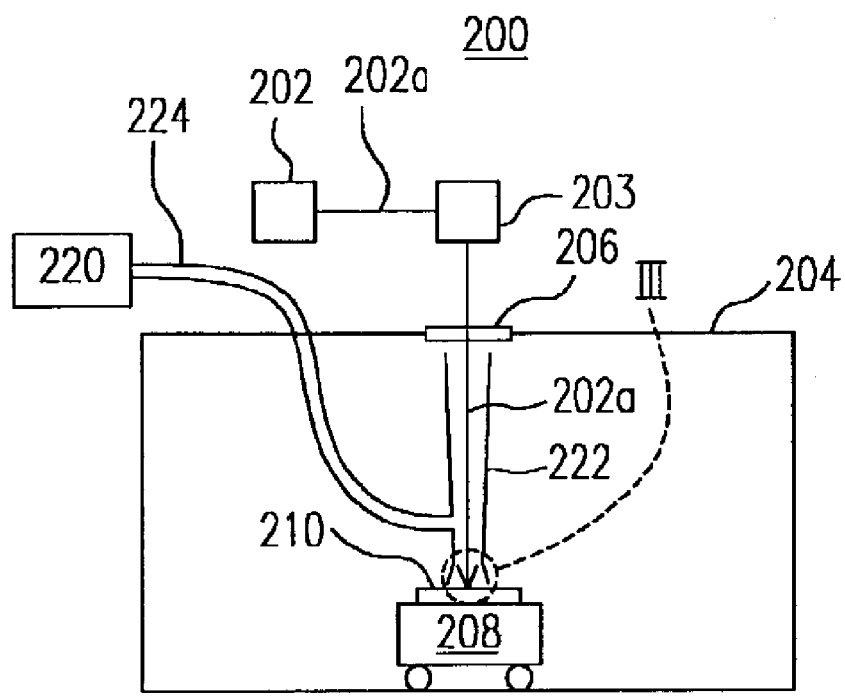
FIG. 2 is a schematic diagram of a laser annealing apparatus according to one preferred embodiment of this invention.

FIG. 2 is a schematic diagram of a laser annealing apparatus according to one preferred embodiment of this invention. As shown in FIG. 2, a laser annealing apparatus 200 includes a laser source 202, a gas supply device 220, a chamber 204 and a movable device 208 inside the chamber and a gas diversion nozzle 222. The laser annealing device 200 may further include an optical system 203 between the laser light source 202 and the chamber 204 for channeling a beam of laser 202a from the laser source 202 into the chamber 204. An incoming laser window 206 is also mounted on top of the chamber 204 so that the laser beam 202a is able to pass into the chamber 204 via the incoming laser window 206. In general, the laser window 206 is made from a material such as quartz glass.

A substrate 210 having an amorphous silicon film thereon is placed over the movable device 208 inside the chamber 204. The gas diversion nozzle 222 is positioned close to the substrate 210 on the movable device 208 such that the laser beam 202a from the laser source 202 passes through the gas diversion nozzle 222 to irradiate the substrate 210. After scanning the laser beam 202a across the amorphous silicon film on the substrate 210, the amorphous silicon film re-crystallizes into a polysilicon film.

The gas supply device 220 inside the laser annealing apparatus 200 connects with the gas diversion nozzle 222 inside the chamber 204 through a tube 224. Thus, the gas from the gas supply device 220 is transported to the laser beam 202a irradiated region through the gas diversion nozzle 222. Through the stream of gas provided by the gas supply device 220, any harmful gases generated when the substrate 210 is laser-irradiated are carried away. Since the harmful gases include silicon vapor evaporated from the amorphous silicon film at a high temperature, the gas diversion nozzle 222 according to this invention also draws away the silicon vapor and hence lowers the probability of having the incoming laser window 206 contaminated.

Figure 3:
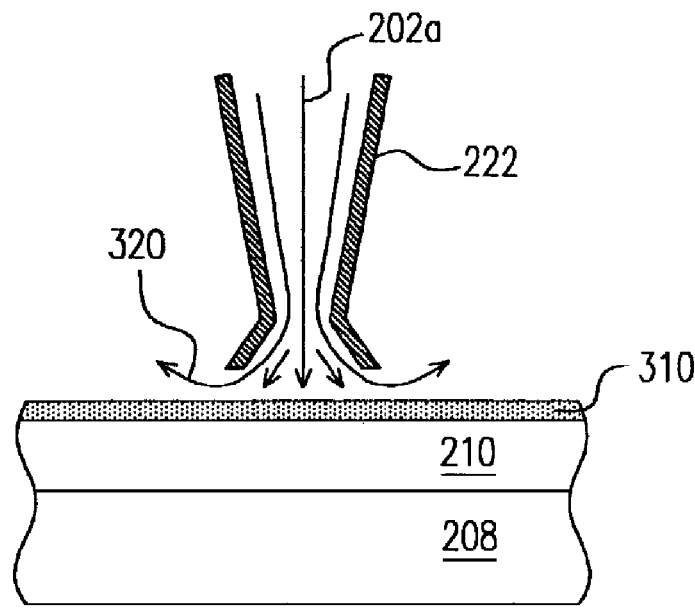
FIG. 3 is a magnified view of section III in FIG. 2.

To explain the relationships between the gas diversion nozzle, the laser beam and the gas supply device, refer to FIG. 3. FIG. 3 is a magnified view of section III in FIG. 2. As shown in FIG. 3 the substrate 210 on the movable device 208 has an amorphous silicon film 310. When the laser beam 202a passes through the gas diversion nozzle 222 to illuminate the substrate 210, the amorphous silicon film 310 will re-crystallize into a polysilicon film. In the meantime, the gas 320 provided by the gas supply device 220 (refer to FIG. 2) will pass through the gas diversion nozzle 222 and impinges upon the laser-irradiated amorphous silicon film 310 over substrate 210. In this embodiment, the gas diversion nozzle 222 is narrow in the middle but wider at both ends. In other word, the gas diversion nozzle 222 has a funnel shape. After bringing a jet of gas 320 to the substrate 210, any harmful gases generated during the laser beam 202a irradiated substrate 210 will be carried away by the outgoing gas stream.

Figure 4:
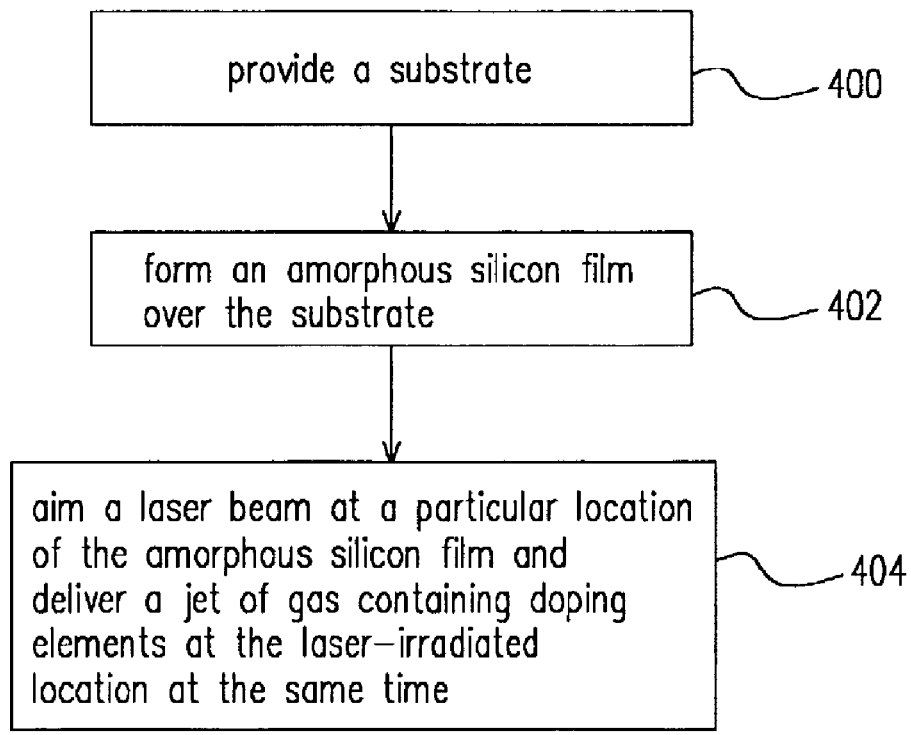
FIG. 4 is a flow chart showing the steps of using the laser annealing apparatus in FIG. 2 to produce a polysilicon thin film.

FIG. 4 is a flow chart showing the steps of using the laser annealing apparatus in FIG. 2 to produce a polysilicon thin film. In step 400, a substrate is provided. In step 402, an amorphous silicon film is formed over the substrate. Thereafter, in step 404, a beam of laser is shone on a particular location of the amorphous silicon film. In the meantime, a gas containing some doping elements is passed over the laser-irradiated region of the amorphous silicon film so that the amorphous silicon film melts and re-crystallizes into polysilicon film. The gas containing doping element includes phosphene (PH$_3$). Since the doping element within the gas transforms the amorphous silicon film into a doped polysilicon film, a doping operation such as a low density channel doping is saved from the process of forming the polysilicon thin film transistor.

One major aspect of this invention is the deployment of a gas diversion nozzle inside a reaction chamber that can deliver a jet of nitrogen, inert gas or a gas containing doping elements accurately onto a laser-irradiated region. Aside from providing an inert atmosphere around a processing film or doping the processing film, any harmful gases produced by the irradiation can also be carried away along with the gas outflow. Consequently, this invention not only stabilizes the atmosphere surrounding the laser-irradiated region, but also wastes very little gas. This invention also prevents any products that result from the reaction of vaporized silicon with moisture and oxygen in the process of fabricating polysilicon thin film transistor from contaminating the laser annealing apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A laser annealing apparatus, comprising:
   a chamber;
   a movable device positioned inside the chamber;
   a gas diversion nozzle positioned inside the chamber close to the movable device to target at a location on the movable device;
   a laser source for emitting a beam of laser into the chamber, wherein the laser beam passes through the gas diversion nozzle to target at the location on the movable device; and
   a gas supply device directly connected with the gas diversion nozzle for delivering a jet of gas comprising at least a channel doping element to the laser-irradiated location on the movable device.

2. The apparatus of claim 1, wherein the gas diversion nozzle has a sectional profile having a narrow mid-portion but wide at both ends.

3. The apparatus of claim 1, wherein the gas diversion nozzle has a funnel shape.

4. The apparatus of claim 1, wherein the annealing apparatus may further include an optical system between the laser source and the chamber for channeling the beam of laser from the laser source to a particular location on the movable device.

5. The apparatus of claim 4, wherein the chamber may further include an incoming laser window that corresponds with the optical system so that the laser beam passes into the chamber via the incoming laser window.

6. The apparatus of claim 5, wherein the incoming laser window is made of quartz glass.

7. The apparatus of claim 1, wherein the annealing apparatus may further include a tube for connecting the gas supply device with the gas diversion nozzle.

8. The apparatus of claim 1, wherein the channel doping element comprises phosphene (PH$_3$).

9. A laser annealing apparatus, comprising:
   a chamber;
   a movable device positioned inside the chamber;
   a gas diversion nozzle positioned inside the chamber close to the movable device to target at a location on the movable device;
   a laser source for emitting a beam of laser into the chamber, wherein the laser beam passes through the gas diversion nozzle to target at the location on the movable device; and
   a gas supply device directly connected with the gas diversion nozzle for delivering a jet of gas comprising nitrogen gas to the laser-irradiated location on the movable device.

10. The apparatus of claim 9, Wherein the jet of gas further comprises a channel doping element.

11. The apparatus of claim 10, wherein the channel doping element comprises phosphene (PH$_3$).

12. The apparatus of claim 9, wherein the gas diversion nozzle has a sectional profile having a narrow mid-portion but wide at both ends.

13. The apparatus of claim 9, wherein the gas diversion nozzle has a funnel shape.

14. The apparatus of claim 9, wherein the annealing apparatus may further include an optical system between the laser source and the chamber for channeling the beam of laser from the laser source to a particular location on the movable device.

15. The apparatus of claim 14, wherein the chamber may further include an incoming laser window that corresponds with the optical system so that the laser beam passes into the chamber via the incoming laser window.

16. The apparatus of claim 9, wherein the incoming laser window is made of quartz glass.

17. The apparatus of claim 9, wherein the annealing apparatus may further include a tube for connecting the gas supply device with the gas diversion nozzle.

* * * * *